United States Patent
Lee et al.

(10) Patent No.: US 10,222,408 B2
(45) Date of Patent: Mar. 5, 2019

(54) ANTENNA DETECTION SYSTEM AND METHOD

(71) Applicant: Getac Technology Corporation, Hsinchu (TW)

(72) Inventors: Yen-Ching Lee, Taipei (TW); Jia-Min Huang, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 15/046,534

(22) Filed: Feb. 18, 2016

(65) Prior Publication Data

US 2017/0122994 A1    May 4, 2017

(51) Int. Cl.
    *G01R 29/10*    (2006.01)
    *G01R 29/08*    (2006.01)

(52) U.S. Cl.
    CPC ......... *G01R 29/10* (2013.01); *G01R 29/0892* (2013.01)

(58) Field of Classification Search
    CPC ............................. G01R 29/10; G01R 29/0892
    See application file for complete search history.

(56) References Cited

U.S. PATENT DOCUMENTS

| | | | | |
|---|---|---|---|---|
| 6,031,498 A * | 2/2000 | Issler | ..................... | G01R 29/10 342/351 |
| 6,448,787 B1 * | 9/2002 | Oglesby | ................. | G01R 29/10 324/612 |
| 8,742,997 B2 * | 6/2014 | Nickel | ............... | G01R 31/2822 343/700 R |
| 2006/0197538 A1 * | 9/2006 | Leinonen | ............... | H01Q 1/243 324/533 |
| 2010/0315280 A1 * | 12/2010 | Bakhtar | .................. | G01S 13/02 342/22 |

(Continued)

FOREIGN PATENT DOCUMENTS

| | | |
|---|---|---|
| CN | 101487864 A | 7/2009 |
| CN | 204330828 U | 5/2015 |

OTHER PUBLICATIONS

CNIPA National Intellectual Property Administration, PRC, "Office Action", dated Sep. 18, 2018, China.

*Primary Examiner* — Son Le
*Assistant Examiner* — Akm Zakaria
(74) *Attorney, Agent, or Firm* — Locke Lord LLP; Tim Tingkang Xia, Esq.

(57) ABSTRACT

An antenna detection system for detecting an antenna under test is provided. The antenna detection system includes a network analyzer and a test device. The test device includes: a first substrate; a second substrate parallel to the first substrate and carrying the antenna under test removably; and a standard antenna fixedly disposed on the first substrate to receive a test signal from a first port of the network analyzer and send a radiation signal according to the test signal. The antenna under test receives the radiation signal and sends a to-be-measured signal to a second port of the network analyzer. The network analyzer obtains a parameter according to the test signal and the to-be-measured signal and compares the parameter with a theoretical value calculated according to an operating frequency corresponding to the antenna under test and a constant interval to output a detection result of the antenna under test.

18 Claims, 8 Drawing Sheets

(56) References Cited

U.S. PATENT DOCUMENTS

| | | | |
|---|---|---|---|
| 2011/0101249 A1* | 5/2011 | Besnard | H01L 21/68707 250/492.21 |
| 2014/0179239 A1* | 6/2014 | Nickel | H04W 24/00 455/67.14 |
| 2015/0015275 A1* | 1/2015 | Huang | G01M 5/0033 324/633 |
| 2015/0162656 A1* | 6/2015 | Fitz-Coy | H01Q 1/288 343/705 |

* cited by examiner

ANTENNA DETECTION SYSTEM AND METHOD

CROSS-REFERENCE TO RELATED APPLICATIONS

This non-provisional application claims priority under 35 U.S.C. § 119(a) on Patent Application No. 201510737694.1 filed in China on Nov. 4, 2015, the entire contents of which are hereby incorporated by reference.

BACKGROUND OF THE INVENTION

Field of the Invention

The present invention relates to detection systems and methods and more particularly to an antenna detection system and method.

Description of the Prior Art

The ongoing rapid development of the wireless communication industry is accompanied by an increasingly great demand for antennas applicable to the wireless communication industry, as radios, TV sets, mobile phones, and the like transmit sound, images or other related data with antennas. Therefore, antennas are regarded as a key factor in ensuring the quality of communication. In view of this, a detection process is important to any antennas at the end of a manufacturing process thereof.

Conventional ways of measuring an antenna mostly involve measuring a return loss (a S11 parameter) of the antenna with a network analyzer and then determining the quality of the antenna by the network analyzer or testing workers according to the measured return loss. However, the S11 parameter fails to reflect the actual gain of the antenna, thereby compromising the communication quality and yield of applicable wireless communication products.

SUMMARY OF THE INVENTION

In view of the aforesaid drawback of the prior art, it is an objective of the present invention to provide an antenna detection system and method for detecting an antenna under test.

In an embodiment, an antenna detection system comprises a network analyzer and a test device. The test device comprises a first substrate, a second substrate and a standard antenna. The second substrate and the first substrate are parallel. The antenna under test is removably disposed on the second substrate. The standard antenna is fixedly disposed on the first substrate, receives a test signal from a first port of the network analyzer, and sends a radiation signal according to the test signal. The antenna under test is disposed on the second substrate and electrically connected to a second port of the network analyzer, such that the antenna under test receives the radiation signal. The standard antenna and the antenna under test are separated at a constant interval. The antenna under test receives the radiation signal, generates a to-measure signal, and sends the to-measure signal to the second port of the network analyzer. The network analyzer obtains a S21 parameter (positive transmission coefficient) according to the test signal and the to-measure signal, and compares the S21 parameter with a theoretical value to thereby output a detection result of the antenna under test. The theoretical value is calculated according to the constant interval and an operating frequency corresponding to the antenna under test.

In an embodiment, an antenna detection method comprises the steps of: calculating a theoretical value according to an operating frequency and a constant interval, with the operating frequency corresponding to the antenna under test; keeping the antenna under test and the standard antenna at the constant interval with a test device; generating and sending a test signal from a network analyzer to the standard antenna; emitting a radiation signal from the standard antenna according to the test signal; receiving the radiation signal by the antenna under test and generating a to-measure signal according to the radiation signal by the antenna under test; obtaining a S21 parameter (positive transmission coefficient) of the antenna under test according to the test signal and the to-measure signal by the network analyzer; and comparing the S21 parameter with the theoretical value to thereby generate and send a detection result of the antenna under test.

In conclusion, according to the embodiments of the present invention, an antenna detection system and method are characterized in that: a test device keeps an antenna under test and a standard antenna at a constant interval, and a network analyzer measures and compares a S21 parameter of the antenna under test, so as to determine quickly and accurately whether the actual gain of the antenna under test meets requirements and enhance the efficiency of detection operations and the quality of antennas greatly.

DETAILED DESCRIPTION OF THE EMBODIMENTS

Figure 1:
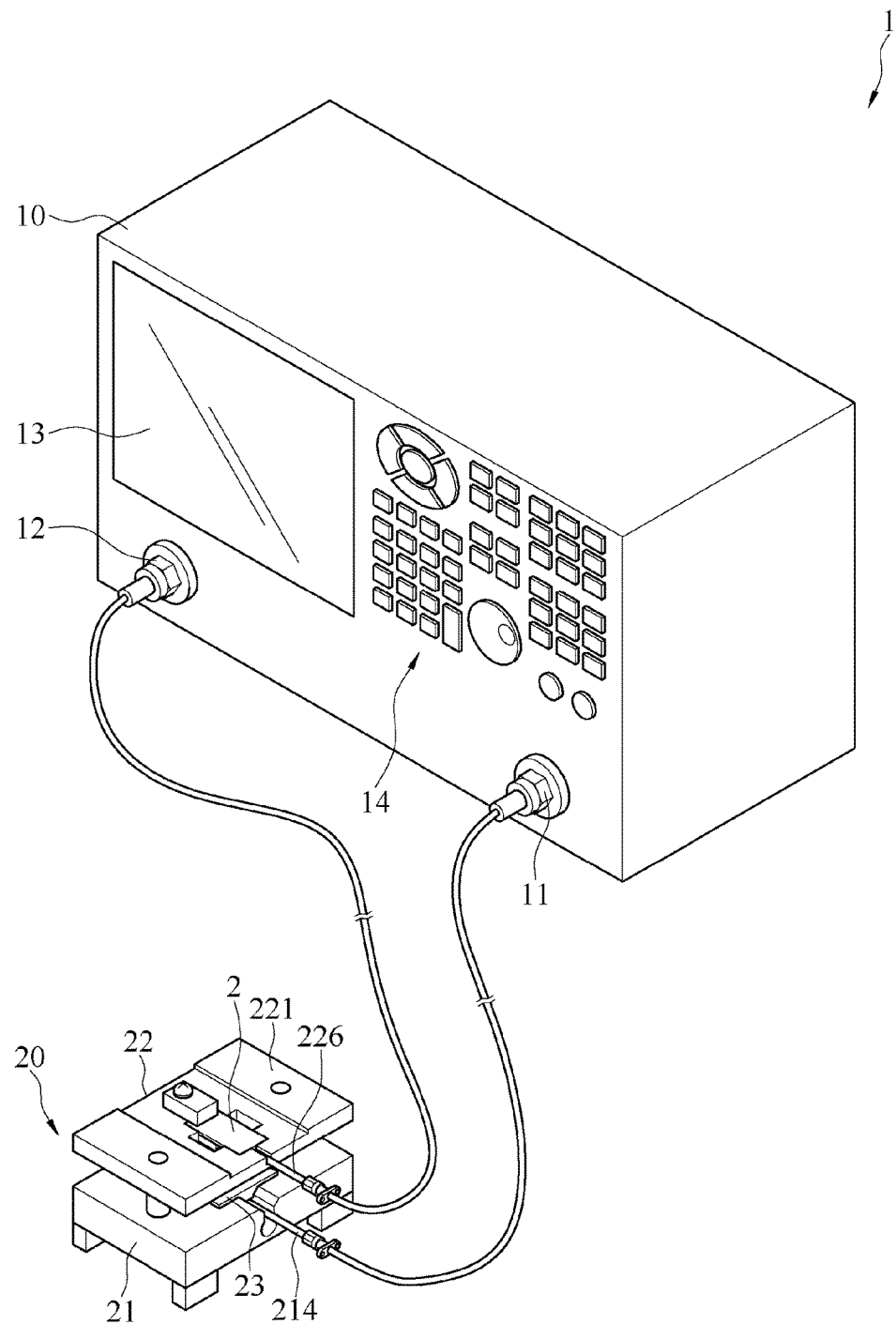
FIG. 1 is a perspective view of an antenna detection system according to an embodiment of the present invention.
Figure 2:
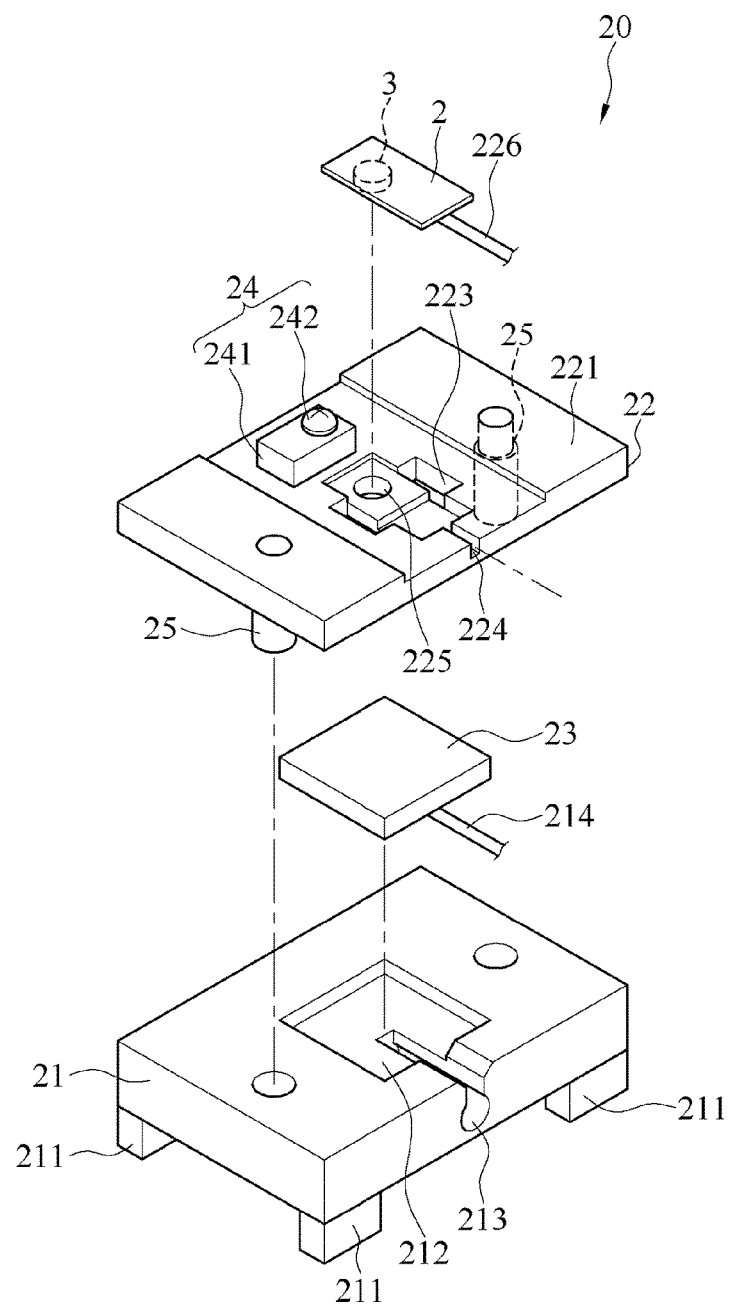
FIG. 2 is an exploded view of a test device according to an embodiment of the present invention.

FIG. 1 and FIG. 2 are a perspective view and an exploded view of an antenna detection system 1 according to an embodiment of the present invention, respectively. Referring to FIG. 1 and FIG. 2, the antenna detection system 1 detects an antenna under test 2. In some embodiments, the antenna under test 2 is preferably an active antenna, but the antenna under test 2 may also be a passive antenna or an antenna of any other type, and therefore the present invention is not limited thereto. In this embodiment, the antenna detection system 1 comprises a network analyzer 10 and a test device 20.

The network analyzer 10 measures the characteristics of various active or passive devices. The network analyzer 10 comprises at least two connection ports. For illustrative sake, this embodiment is exemplified by two connection ports, namely a first port 11 and a second port 12. The first port 11 emits signals, whereas the second port 12 receives signals. In some embodiments, the network analyzer 10 further comprises a processing unit (not shown), a display screen 13, and an operation interface 14. The processing unit executes at least one detection process. In any of the at least one detection process, the processing unit receives a signal from an object under test by executing a firmware or software algorithm, obtains a detection result by performing a computation operation according to the received signal, and displays the detection result on the display screen 13. The processing unit is a microprocessor, a microcontroller, a digital signal processor, a microcomputer, a CPU, a field-programmable gate array (FPGA), a programmable logical apparatus, a state machine, a logical circuit, an analog circuit, or a digital circuit.

The test device 20 comprises a first substrate 21, a second substrate 22, and a standard antenna 23. The first substrate 21 and the second substrate 22 are parallel. The antenna under test 2 is removably disposed on the second substrate 22. Therefore, the antenna under test 2 is mounted on the second substrate 22 and removable therefrom. The standard antenna 23 is fixedly disposed on the first substrate 21. In some embodiments, the standard antenna 23 is a passive antenna, but the standard antenna 23 may also be an active antenna or an antenna of any other type, and therefore the present invention is not limited thereto. In some embodiments, the standard antenna 23 is also mounted on the first substrate 21 and removable therefrom.

In some embodiments, two support posts 25, which point in the same direction and have the same length, are fixedly connected between the first substrate 21 and the second substrate 22, such that the first substrate 21 and the second substrate 22 are separated by a fixed distance and parallel. In some embodiments, the second substrate 22 is disposed above the first substrate 21.

In some embodiments, the two support posts 25 are positioned proximate to two opposing edges of the first substrate 21 and the second substrate 22, respectively, and therefore provide stable support. In practice, the quantity, length and positions of the support posts 25 are adjustable as needed; for example, one support post 25 or at least two support posts 25 are connected between the first substrate 21 and the second substrate 22, but the present invention is not limited thereto. In some embodiments, the support posts 25 are each connected between the first substrate 21 and the second substrate 22 when engaged therewith or fastened thereto, such that the support posts 25, the first substrate 21 and the second substrate 22 can be removably separated. In some embodiments, the support posts 25 are each fixedly connected to the first substrate 21 and the second substrate 22 by adhesion.

In some embodiments, a plurality of bottom pins 211 is formed integrally with or coupled to the first substrate 21 from below, such that the first substrate 21 is separated by a distance from a plane which the test device 20 is placed on, and in consequence workers mounting an object (such as the standard antenna 23) on the first substrate 21 have much room for manipulating their hands to therefore carry out the assembly process quickly and easily.

In some embodiments, the standard antenna 23 receives a test signal S1 from the first port 11 of the network analyzer 10, and the standard antenna 23 sends a radiation signal S2 according to the test signal S1. The antenna under test 2 is electrically connected to the second port 12 of the network analyzer 10, such that the antenna under test 2 receives the radiation signal S2 from the standard antenna 23.

In some embodiments, a depression 212 and a wiring groove 213 are disposed on the top surface (which faces the second substrate 22) of the first substrate 21, such that the standard antenna 23 is embedded or disposed in the depression 212 and therefore fixedly disposed on the first substrate 21. The wiring groove 213 is in communication with the depression 212 and exposed from a lateral surface of the first substrate 21. A first transmission line 214, such as a cable or a conventional signal transmission line, is penetratingly disposed in the wiring groove 213. The first transmission line 214 has one end electrically connected to the standard antenna 23 and the other end electrically connected to the first port 11 of the network analyzer 10, such that the standard antenna 23 receives the test signal S1 from the first port 11 of the network analyzer 10.

In some embodiments, the second substrate 22 has an upper surface 221, a lower surface 222 and a receiving recess 223. The lower surface 222 faces the first substrate 21. The upper surface 221 faces away from the first substrate 21 relative to the lower surface 222; hence, the upper surface 221 faces upward. The receiving recess 223 is concavely disposed on the upper surface 221. In some embodiments, the antenna under test 2 is disposed in the receiving recess 223 and removable therefrom such that, upon completion of a testing process, the antenna under test 2 can be taken out and replaced with another antenna under test 2 to undergo the testing process. Therefore, testing workers can change the antenna under test 2 quickly in the event of intensive testing.

Figure 3:
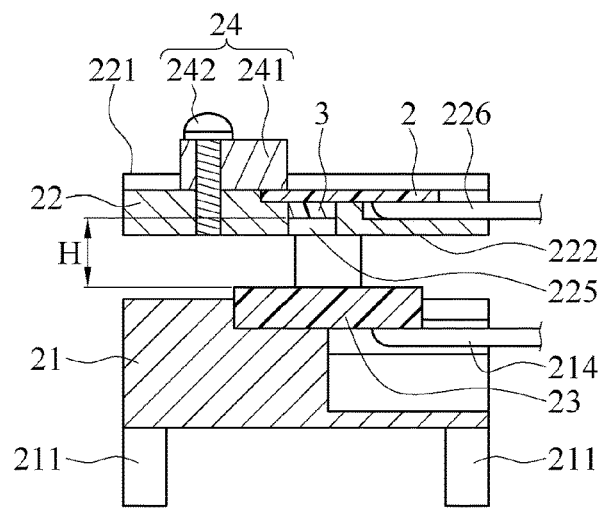
FIG. 3 is a cross-sectional view of the test device according to an embodiment of the present invention.

Referring to FIG. 3, there is shown a cross-sectional view of the test device 20 according to an embodiment of the present invention. In this embodiment, the second substrate 22 is penetrated by a through hole 225 exposed from the lower surface 222 and the bottom of the receiving recess 223. An antenna unit 3 of the antenna under test 2 is disposed in the through hole 225, whenever the antenna under test 2 is disposed in the receiving recess 223. Therefore, not only does the antenna unit 3 face the standard antenna 23, but there is also not any barrier between the antenna unit 3 and the standard antenna 23, thereby enhancing signal transmission.

With the standard antenna 23 being disposed on the first substrate 21 and the antenna under test 2 being disposed on the second substrate 22, the standard antenna 23 and the antenna under test 2 are kept at a constant interval H. The constant interval H is adjustable according to testing needs. In some embodiments, the constant interval H is directly proportional to the distance between the first substrate 21 and the second substrate 22. Therefore, the constant interval H between the standard antenna 23 and the antenna under test 2 increases with the distance between the first substrate 21 and the second substrate 22. The constant interval H will become invariable, only if the distance between the first substrate 21 and the second substrate 22 is fixed.

In some embodiments, the constant interval H between the standard antenna 23 and the antenna under test 2 equals the shortest distance (shown in FIG. 3 and indicated by the constant interval H) between the top end of the antenna unit 3 of the antenna under test 2 and the surface of the standard antenna 23, but the present invention is not limited thereto. In some embodiments, the constant interval H equals the shortest distance between any standard antenna-facing surface of the antenna under test 2 and the surface of the standard antenna 23.

In some embodiments, the second substrate 22 further has a wire groove 224. The wire groove 224 is concavely disposed on the upper surface 221, in communication with the receiving recess 223, and exposed from a lateral side of the upper surface 221. A second transmission line 226, such as a cable or a conventional signal transmission line, is penetratingly disposed in the wire groove 224. The second transmission line 226 has one end electrically connected to the antenna under test 2 and the other end electrically connected to the second port 12 of the network analyzer 10, such that the antenna under test 2 sends signals to the second port 12 of the network analyzer 10.

Figure 4:
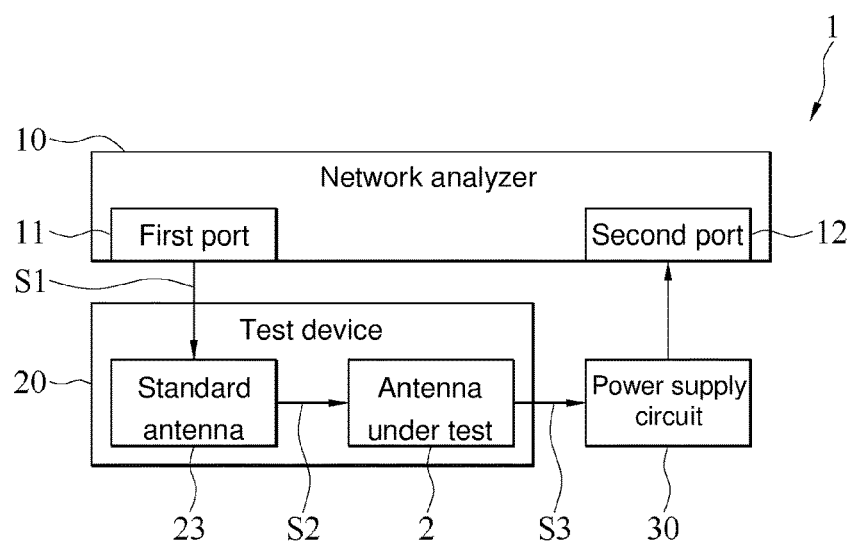
FIG. 4 is a block diagram of a circuit of the antenna detection system according to an embodiment of the present invention.

Referring to FIG. 4, in some embodiments, with the operation interface 14 (shown in FIG. 1), the testing workers instruct the first port 11 of the network analyzer 10 to send the test signal S1 to the standard antenna 23. Upon receipt of the test signal S1, the standard antenna 23 begins sending the radiation signal S2. After receiving the radiation signal S2, the antenna under test 2 generates a to-be-measured signal S3 and sends the to-be-measured signal S3 to the second port 12 of the network analyzer 10. Since the network analyzer 10 is electrically connected to the standard antenna 23 by the first transmission line 214 and to the antenna under test 2 by the second transmission line 226, the test signal S1 and the to-be-measured signal S3 are sent through the transmission lines. Since there is the constant interval H between the standard antenna 23 and the antenna under test 2, the radiation signal S2 sent from the standard antenna 23 is then sent to the antenna under test 2 through the air medium. The network analyzer 10 obtains a S21 parameter (positive transmission coefficient) according to the test signal S1 and the to-be-measured signal S3.

In some embodiments, after receiving the test signal S1 and the to-be-measured signal S3, the network analyzer 10 generates the S21 parameter directly and displays it on the display screen 13.

In some embodiments, the S21 parameter is expressed with the formulas as follows: S21 parameter=G1+FSPL+G3, and $$FSPL = 10\log\left[\left(\frac{4\pi}{c}df\right)^2\right],$$

wherein G1 denotes the (predetermined or non-predetermined) gain of the standard antenna 23, G3 denotes the actual gain of the antenna under test 2, and FSPL denotes free-space path loss, that is, the loss arising from the air path whereby the radiation signal S2 is sent from the standard antenna 23 to the antenna under test 2, d denotes the constant interval H (say, 1 cm or 3 cm) between the standard antenna 23 and the antenna under test 2, f denotes the operating frequency (say 2.07 GHz) of the antenna under test 2, and c denotes the speed of light. As indicated by the aforesaid formulas, the S21 parameter reflects directly the actual gain of the antenna under test 2.

Afterward, in an embodiment, the network analyzer 10 compares the S21 parameter with a theoretical value. In some embodiments, the theoretical value is calculated according to the constant interval H (say 5 cm or 10 cm) between the standard antenna 23 and the antenna under test 2 and the operating frequency (say 1.56 GHz).

In an embodiment, the theoretical value is calculated with the formulas as follows: I=G1+FSPL+G2, and $$FSPL = 10\log\left[\left(\frac{4\pi}{c}df\right)^2\right],$$

wherein I denotes the theoretical value, G1 denotes the (predetermined or non-predetermined) gain of the standard antenna 23, G2 denotes the (predetermined or non-predetermined) ideal gain of the antenna under test 2, FSPL denotes free-space path loss, d denotes the constant interval H between the standard antenna 23 and the antenna under test 2, f denotes the operating frequency (say 1.56 GHz) of the antenna under test 2, and c denotes the speed of light. As indicated by the foresaid formulas, the theoretical value reflects the ideal gain of the antenna under test 2. Therefore, the theoretical value is a threshold for use in comparison.

In some embodiments, the theoretical value is calculated artificially. For example, the testing workers calculate the theoretical value with the aforesaid formulas and then enter the theoretical value into the network analyzer 10, such that the network analyzer 10 compares the S21 parameter with the theoretical value. In some embodiments, the aforesaid formulas are programmed in the processor of the network analyzer 10 in advance to allow the processor to calculate the theoretical value automatically according to an entered variable. The variable is one or more parameters (such as G2 only, G1 and G2, G2 and d, or G1, G2 and d) used in the aforesaid formulas.

In some embodiments, the network analyzer 10 further comprises a storage unit (not shown) for storing the theoretical value such that, during a detection process, the processor can read a required theoretical value from the storage unit and then compare the theoretical value with the S21 parameter. The storage unit is a volatile memory or a non-volatile memory, such as random access memory (RAM), read-only memory (ROM), or electrically erasable programmable read-only memory (EEPROM).

Figure 9:
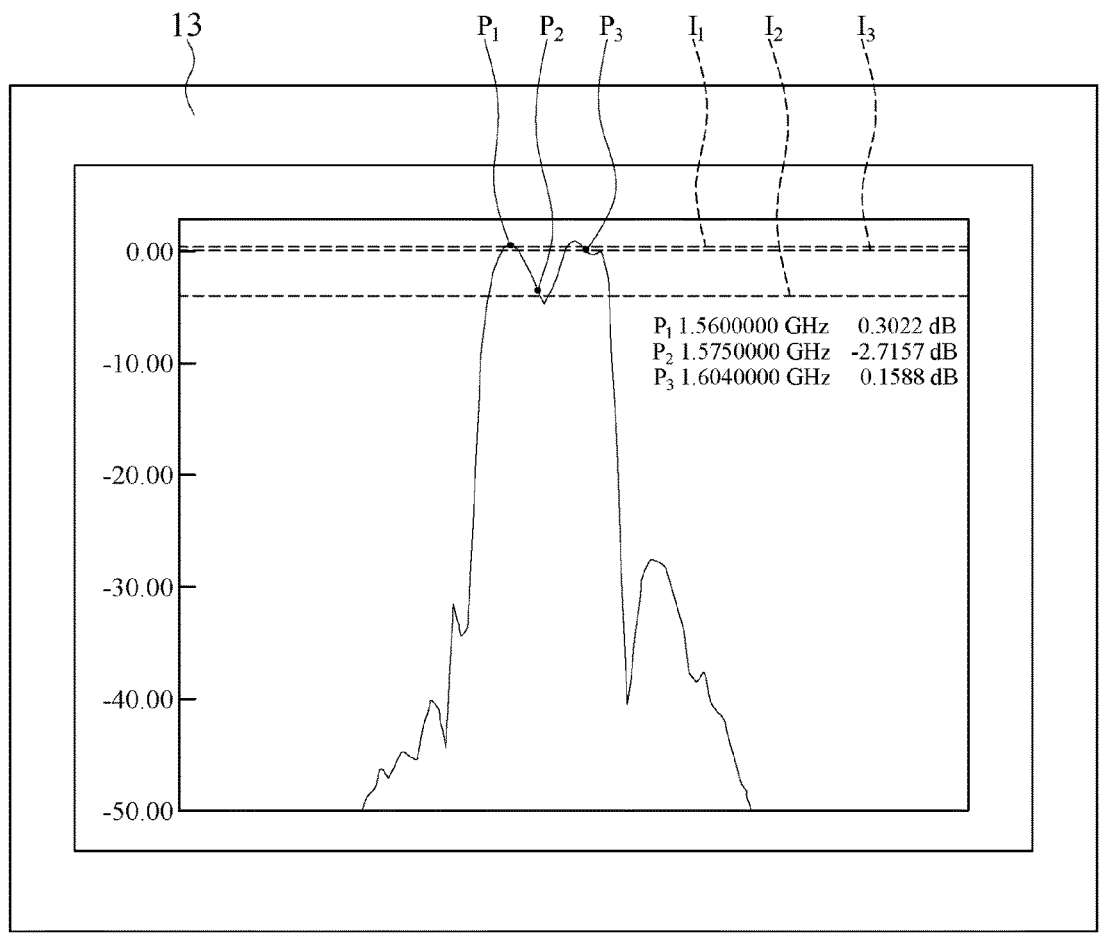
FIG. 9 is a schematic view of a detection result of the antenna detection system according to an embodiment of the present invention.

The comparison of the S21 parameter and the theoretical value yields a detection result of the antenna under test 2, and then the detection result is judged by the testing workers. Referring to FIG. 9, in this embodiment, the display screen 13 of the network analyzer 10 displays a detection frame. Waveforms actually measured and the position of the S21 parameter corresponding to each operating frequency point are shown in the detection frame. For example, the first S21 parameter $P_1$ equals 0.3022 dB (indicated by a point), which is calculated by measuring waveforms when the operating frequency of the antenna under test 2 is set to 1.56 GHz. The first theoretical value $I_1$ equals 0.25 dB (indicated by a transverse line), which is calculated with the aforesaid formulas when the operating frequency of the antenna under test 2 is set to 1.56 GHz. The second S21 parameter $P_2$ equals −2.7157 dB, which is calculated by measuring waveforms when the operating frequency of the antenna under test 2 is set to 1.575 GHz. The second theoretical value $I_2$ equals −3.25 dB, which is calculated with the aforesaid formulas when the operating frequency of the antenna under test 2 is set to 1.575 GHz. The third S21 parameter $P_3$ equals 0.1588 dB, which is calculated by measuring waveforms when the operating frequency of the antenna under test 2 is set to 1.604 GHz. The third theoretical value $I_3$ equals 0.05 dB, which is calculated with the aforesaid formulas when the operating frequency of the antenna under test 2 is set to 1.604 GHz. Since the antenna gain required to serve the aforesaid measurement purpose varies from instance to instance, multiple theoretical values corresponding to different frequency points respectively are set, such that the S21 parameter at different frequency points of the antenna under test 2 is measured to determine whether it conforms with the first theoretical value $I_1$, the second theoretical value $I_2$ or the third theoretical value $I_3$. Alternatively, it is feasible to set one theoretical value only, and therefore the present invention is not limited thereto.

Referring to FIG. 9, in some embodiments, the detection result displayed on the display screen 13 is a result of comparison between the S21 parameter and the theoretical value. For instance, the detection frame shows the positions and values of the S21 parameter and the theoretical value, such that it is feasible to determine whether the S21 parameter is less than, equal to, or larger than the theoretical value according to the mark line of the theoretical value, and therefore determine whether the antenna under test 2 has been tested to satisfaction. For example, the testing workers judge the S21 parameter by watching with the naked eye the S21 parameter and the theoretical value displayed on the display screen 13 and determining which of them is positioned higher. For instance, in this embodiment, take the detection result shown in FIG. 9 as an example, the S21 parameter $P_1$ is larger than the theoretical value $I_1$, and therefore the gain of the antenna under test 2 with an operating frequency of 1.56 GHz is determined to be satisfactory, whereas the S21 parameter $P_2$ is also larger than the theoretical value $I_2$, and therefore the gain of the antenna under test 2 with an operating frequency of 1.575 GHz is determined to be satisfactory. Conversely, if the S21 parameter is less than the theoretical value, the gain will be determined to be unsatisfactory. In some embodiments, the network analyzer 10 automatically determines and indicates whether the antenna under test 2 has been tested to satisfaction. Therefore, the network analyzer 10 automatically compares and determines whether the S21 parameter at different operating frequencies is larger than the theoretical value and then outputs the detection result. The network analyzer 10 presents the detection result in the form of a text, a lamp sign, a graphic, or a combination thereof whereby the testing workers are told whether the antenna under test 2 has been tested to satisfaction. For example, take the text as an example, the word "pass" displayed on the network analyzer 10 means that the antenna under test 2 has been tested to satisfaction, whereas the word "fail" displayed on the network analyzer 10 means that the antenna under test 2 has failed the test. Furthermore, with the network analyzer 10 judging a detection result automatically, the detection frame may output the detection result directly rather than display the theoretical value and/or the measured S21 parameter. In practice, comparisons of the S21 parameter and the theoretical value are configured as needed, and therefore the aforesaid descriptions of comparison are illustrative rather than restrictive of the present invention.

Figure 5:
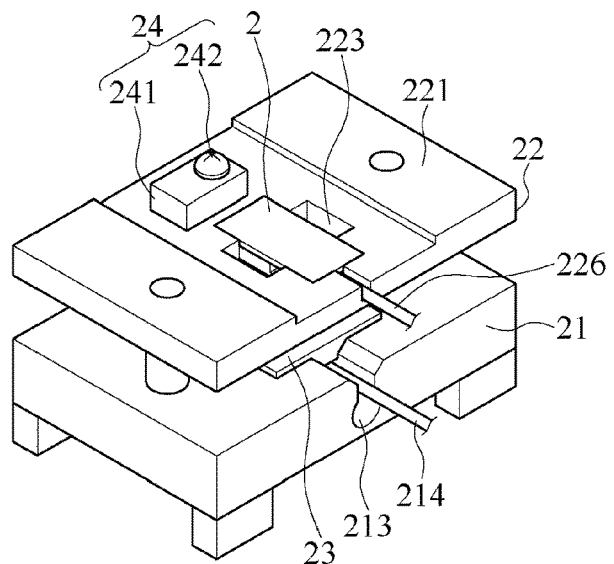
FIG. 5 is a schematic view (1) of the operation of a limiting element of the antenna detection system of FIG. 1 according to an embodiment of the present invention.
Figure 6:
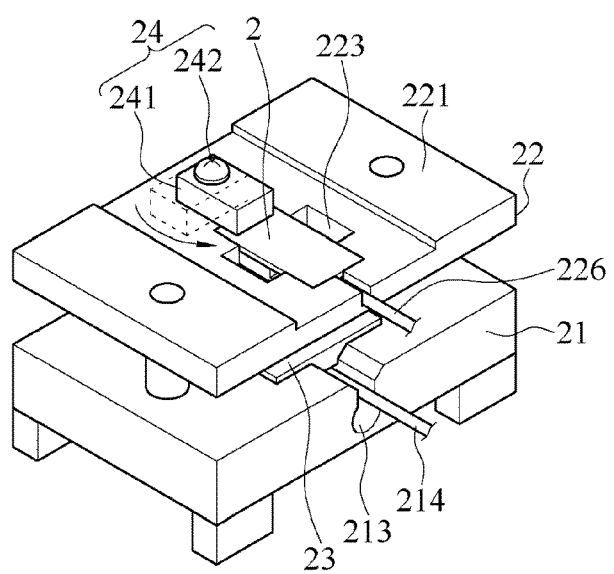
FIG. 6 is a schematic view (2) of the operation of the limiting element of the antenna detection system of FIG. 1 according to an embodiment of the present invention.

In some embodiments, the test device 20 further comprises a limiting element 24. The limiting element 24 is disposed on the second substrate 22. The limiting element 24 fixes or releases the antenna under test 2 selectively whenever the antenna under test 2 is positioned inside the receiving recess 223. Referring to FIG. 5, in this embodiment, the limiting element 24 comprises a weight 241 and an axial post 242. The axial post 242 is fixed to the upper surface 221 of the second substrate 22. One end of the weight 241 is connected to the axial post 242. The weight 241 is rotatable about the axial post 242. Referring to FIG. 6, if the weight 241 rotates in the direction of the receiving recess 223, the other end of the weight 241 abuts against the antenna under test 2 to thereby fix the antenna under test 2 in place and prevent the antenna under test 2 from shaking or escaping readily from the receiving recess 223. At the end of the test conducted on the antenna under test 2, to replace the antenna under test 2 with another antenna under test for use in the next testing session, the weight 241 is rotated in the direction away from the receiving recess 223 to restore the state shown in FIG. 5.

In a variant embodiment, the limiting element 24 is an adjustable screw (not shown) fastened to the second substrate 22. When the adjustable screw is tight, the head of the adjustable screw abuts against the antenna under test 2 to fix the antenna under test 2 in place. By contrast, when the adjustable screw is loosened, the head of the adjustable screw leaves the antenna under test 2, thereby allowing the antenna under test 2 to be dismounted and taken out.

Figure 7:
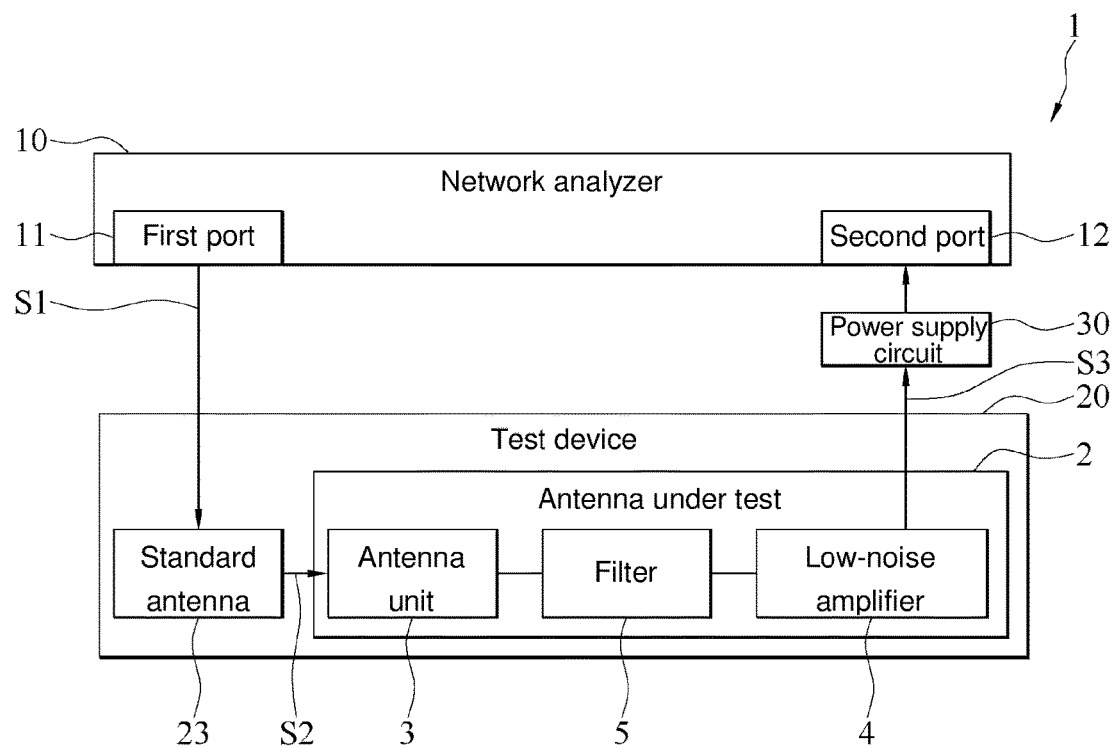
FIG. 7 is a block diagram of a circuit of the antenna detection system according to another embodiment of the present invention.
Figure 8:
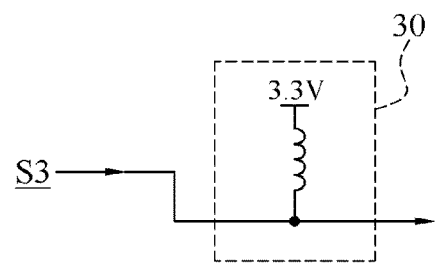
FIG. 8 is a schematic view of a circuit of a power supply circuit of FIG. 7 according to an embodiment of the present invention.

Referring to FIG. 7, there is shown a block diagram of a circuit of the antenna detection system 1 according to another embodiment of the present invention. In this embodiment, the antenna under test 2 further comprises an antenna unit 3, a low-noise amplifier 4 (LNA), and a filter 5. The antenna unit 3 receives the radiation signal S2 sent from the standard antenna 23. The filter 5 is connected between the antenna unit 3 and the low-noise amplifier 4. The low-noise amplifier 4 is connected between the filter 5 and the second port 12 of the network analyzer 10. In this embodiment, the antenna detection system 1 further comprises a power supply circuit 30 (whose circuit is shown in FIG. 8.) In some embodiments, the power supply circuit 30 is connected between the antenna under test 2 and the second port 12 of the network analyzer 10. The power supply circuit 30 supplies electric power to the low-noise amplifier 4 to thereby amplify the to-measure signal S3 sent from the antenna under test 2, and in consequence the to-measure signal S3 thus amplified is processed and used by the network analyzer 10, wherein the amplification ratio depends on designer needs. Therefore, in some embodiments, after receiving the radiation signal S2, the antenna unit 3 emits the to-be-measured signal S3, such that the to-be-measured signal S3 is filtered by the filter 5 and amplified by the low-noise amplifier 4 before being sent to the network analyzer 10.

Figure 10:
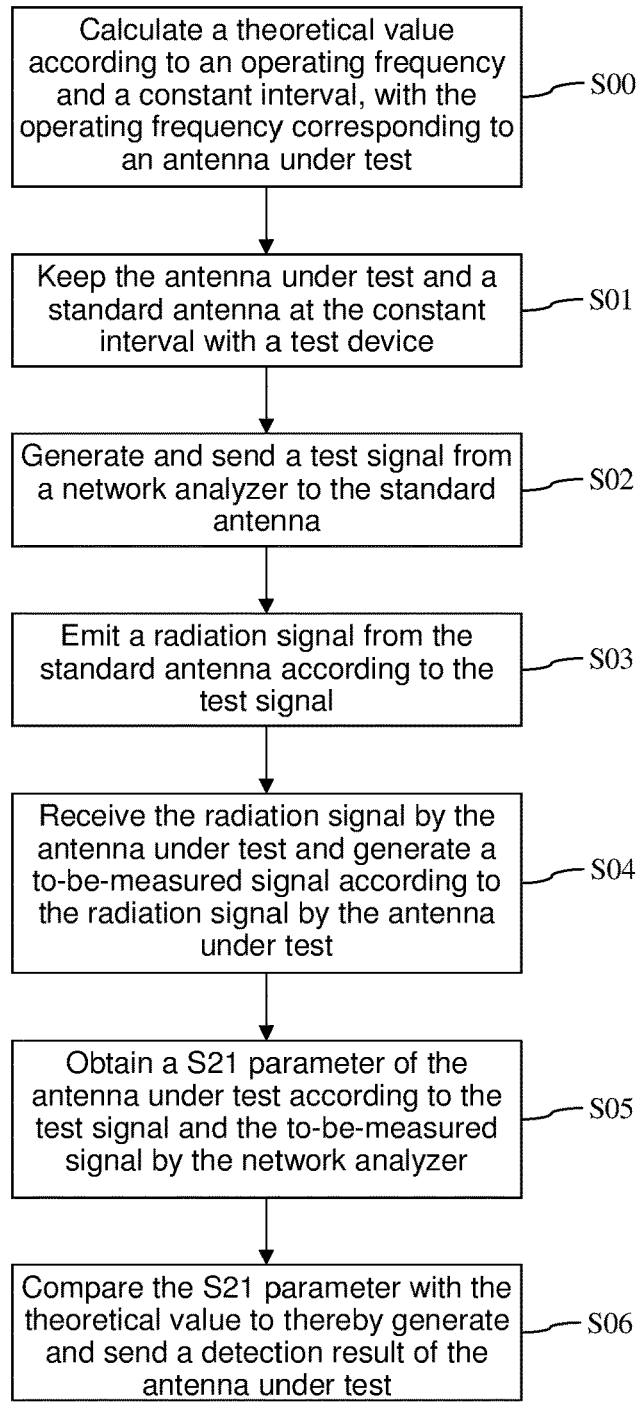
FIG. 10 is a flowchart of an antenna detection method according to the first embodiment of the present invention.

Referring to FIG. 10, there is shown a flowchart of an antenna detection method according to the first embodiment of the present invention. All the hardware structures and transmitted signals described hereunder are identical to their counterparts for use with the antenna detection system 1. The antenna detection method comprises the steps of: calculating a theoretical value according to an operating frequency and the constant interval H, with the operating frequency corresponding to the antenna under test 2 (step S00); keeping the antenna under test 2 and the standard antenna 23 at the constant interval H with the test device 20 (step S01); generating and sending the test signal S1 from the network analyzer 10 to the standard antenna 23 (step S02); emitting the radiation signal S2 from the standard antenna 23 according to the test signal S1 (step S03); receiving the radiation signal S2 by the antenna under test 2 and generating the to-be-measured signal S3 according to the radiation signal S2 by the antenna under test 2 (step S04); obtaining the S21 parameter of the antenna under test 2 according to the test signal S1 and the to-be-measured signal S3 by the network analyzer 10 (step S05); and comparing the S21 parameter with the theoretical value to thereby generate and send a detection result of the antenna under test 2 (step S06).

In step S00, the operating frequency is the frequency (say 1.56 GHz or 1.575 GHz) at which the antenna under test 2 operates.

In step S01, the antenna under test 2 and the standard antenna 23 are fixed to the test device 20 and at two different heights, respectively, to thereby keep the antenna under test 2 and the standard antenna 23 at the constant interval H.

Figure 11:
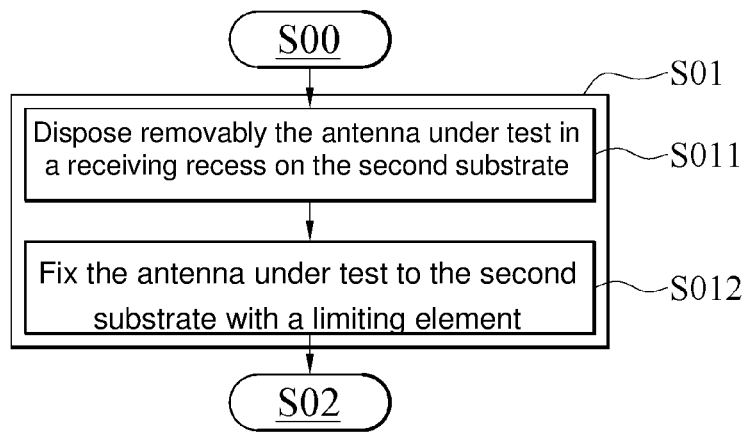
FIG. 11 is a flowchart of the antenna detection method according to the second embodiment of the present invention.

In some embodiments, the test device 20 comprises the first substrate 21 and the second substrate 22 which are parallel and separated by a distance, with the standard antenna 23 fixedly disposed on the first substrate 21. Referring to FIG. 3, the standard antenna 23 is embedded or disposed in the depression 212 of the first substrate 21 and therefore fixed in place. Referring to FIG. 11, there is shown a flowchart of the antenna detection method according to the second embodiment of the present invention. In this embodiment, step S01 entails disposing removably the antenna under test 2 in the receiving recess 223 on the second substrate 22 (step S011) and fixing the antenna under test 2 to the second substrate 22 with the limiting element 24 (step S012).

In step S011, the antenna under test 2 is disposed in the receiving recess 223 of the second substrate 22, such that the antenna under test 2 is fixed in place and separated from the standard antenna 23 by the constant interval H, wherein the antenna under test 2 can be removed from the receiving recess 223 and then replaced with another antenna under test 2 to undergo testing.

In step S012, the limiting element 24 is mounted on the second substrate 22. Referring to FIG. 3, the weight 241 and the axial post 242 are mounted on the second substrate 22 to allow the testing workers to rotate the weight 241 relative to the axial post 242 until the weight 241 abuts against the antenna under test 2 and fixes the antenna under test 2 in place.

In step S02, the network analyzer 10 generates and sends the test signal S1 when operated by the testing workers or in response to the testing workers' entering related data into the network analyzer 10. Alternatively, the network analyzer 10 generates and sends the test signal S1 automatically and continually, and the network analyzer 10 is connected to the standard antenna 23 through a transmission line to thereby send the generated test signal S1 to the standard antenna 23.

In step S03, the standard antenna 23 emits the radiation signal when receiving the test signal S1, wherein the test signal S1 is a trigger signal for driving the standard antenna 23 to emit the radiation signal. In some embodiments, the standard antenna 23 emits the radiation signal according to a configured instruction or message of the test signal S1. For instance, the test signal S1 comprises a specified frequency, and the standard antenna 23 emits the radiation signal according to the specified frequency.

In step S04, since the antenna under test 2 and the standard antenna 23 are separated at the constant interval H, the standard antenna 23 uses air as a medium for sending the radiation signal S2 to the antenna under test 2, such that the antenna under test 2 receives the radiation signal S2 and generates the to-be-measured signal S3 according to the radiation signal S2.

In step S05, after receiving the test signal S1 and the to-be-measured signal S3, the network analyzer 10 generates the S21 parameter directly and displays it on the display screen 13.

In some embodiments, the S21 parameter is expressed with the formulas as follows: S21 parameter=G1+FSPL+G3, and $$FSPL = 10\log\left[\left(\frac{4\pi}{c}df\right)^2\right],$$

wherein G1 denotes the (predetermined or non-predetermined) gain of the standard antenna 23, G3 denotes the actual gain of the antenna under test 2, FSPL denotes free-space path loss, that is, the loss arising from the air path whereby the radiation signal S2 is sent from the standard antenna 23 to the antenna under test 2, d denotes the constant interval H (say 1 cm or 3 cm) between the standard antenna 23 and the antenna under test 2, f denotes the operating frequency (say 2.07 GHz) of the antenna under test 2, and c denotes the speed of light.

In step S06, the theoretical value is calculated with the formulas below:
I=G1+FSPL+G2, and $$FSPL = 10\log\left[\left(\frac{4\pi}{c}df\right)^2\right],$$

wherein I denotes the theoretical value, G1 denotes the (predetermined or non-predetermined) gain of the standard antenna 23, G2 denotes the (predetermined or non-predetermined) ideal gain of the antenna under test 2, FSPL denotes free-space path loss, d denotes the constant interval H between the standard antenna 23 and the antenna under test 2, f denotes the operating frequency (say 1.56 GHz) of the antenna under test 2, and c denotes the speed of light. As indicated by the aforesaid formulas, the theoretical value reflects the ideal gain of the antenna under test 2. Therefore, the theoretical value is a threshold for use in comparison.

In step S06, the network analyzer 10 displays on the display screen 13 (shown in FIG. 9) a position at which a comparison of the S21 parameter and the theoretical value is feasible, such that the testing workers can watch and compare them to obtain a detection result. Alternatively, the network analyzer 10 compares the S21 parameter with the theoretical value automatically to yield a detection result, and the network analyzer 10 presents the detection result in the form of a text, a lamp sign, a graphic, or a combination thereof whereby the testing workers are told whether the antenna under test 2 has been tested to satisfaction.

Figure 12:
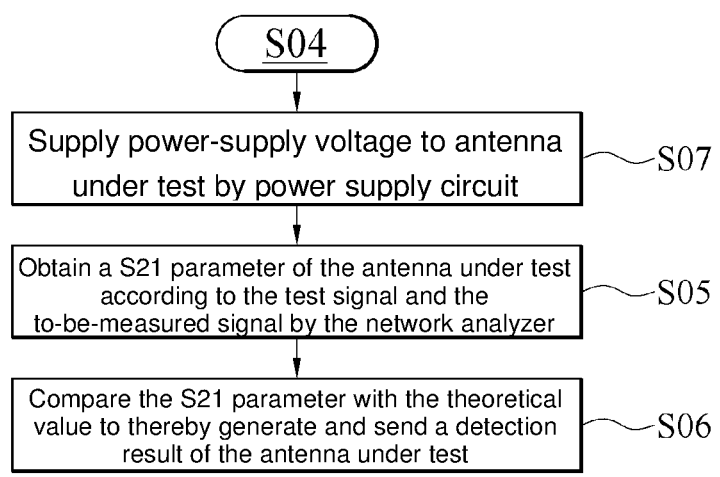
FIG. 12 is a flowchart of the antenna detection method according to the third embodiment of the present invention.

Referring to FIG. 12, there is shown a flowchart of the antenna detection method according to the third embodiment of the present invention. In this embodiment, the antenna detection method further comprises the step of supplying a power-supply voltage to the antenna under test 2 by the power supply circuit 30 (step S07).

In step S07, the power-supply voltage supplied by the power supply circuit 30 drives the low-noise amplifier 4 of the antenna under test 2 to amplify the to-be-measured signal S3 emitted from the antenna under test 2, such that the to-be-measured signal S3 thus amplified can be processed and used by the network analyzer 10.

Although the aforesaid steps are described in sequence, the sequence of the aforesaid steps is not restrictive of the present invention, as persons skilled in the art understand that, in a reasonable situation, some of the aforesaid steps may occur simultaneously or in a reverse sequence. For instance, the step of emitting the radiation signal S2 from the standard antenna 23 according to the test signal S1 (step S03) and the step of supplying the power-supply voltage to the antenna under test 2 by the power supply circuit 30 (step S07) occur simultaneously.

In conclusion, according to the embodiments of the present invention, an antenna detection system and method are characterized in that: a test device keeps an antenna under test and a standard antenna at a constant interval, and a network analyzer measures and compares a S21 parameter of the antenna under test, so as to determine quickly and accurately whether the actual gain of the antenna under test meets requirements, enhance the efficiency of detection operations and the quality of antennas, and enhance the communication quality of applicable wireless communication products.

Although the present invention is disclosed above by preferred embodiments, the embodiments are not restrictive of the present invention. Any persons skilled in the art can make some changes and modifications to the embodiments without departing from the spirit of the present invention. Accordingly, the legal protection for the present invention should be defined by the appended claims.

What is claimed is:

1. An antenna detection system, for detecting an antenna under test, comprising:
    a network analyzer;
    a test device, comprising:
        a first substrate;
        a second substrate parallel to the first substrate, wherein the antenna under test is removably disposed on the second substrate;
        a weight that is rotatable about an axial post, wherein the axial post is fixed to the upper surface of the second substrate and one end of the weight abuts against the antenna under test to thereby fix the antenna under test during a testing session;
        a standard antenna fixedly disposed on the first substrate to receive a test signal from a first port of the network analyzer and send a radiation signal according to the test signal, wherein the antenna under test comprises a low-noise amplifier, is disposed on the second substrate and is electrically connected to a second port of the network analyzer, such that the antenna under test receives the radiation signal, wherein the standard antenna and the antenna under test are separated at an interval, wherein the interval is adjustable according to testing needs,
    wherein the antenna under test receives the radiation signal, generates a to-be-measured signal, and sends the to-be-measured signal to the second port of the network analyzer, such that the network analyzer obtains a S21 parameter according to the test signal and the to-be-measured signal and compares the S21 parameter with a theoretical value to thereby output a detection result of the antenna under test, and
    wherein the theoretical value is calculated according to the interval and an operating frequency corresponding to the antenna under test; and
    a power supply circuit, wherein the power supply circuit supplies electric power to the low-noise amplifier to thereby amplify the to-be-measured signal sent from the antenna under test; wherein the first port of the network analyzer, the standard antenna, the antenna under test, the power supply circuit and the second port of the network analyzer are connected to each other sequentially.

2. The antenna detection system of claim 1, wherein the second substrate has an upper surface, a lower surface and a receiving recess, with the lower surface facing the first substrate and the upper surface facing away from the first substrate relative to the lower surface, wherein the receiving recess is disposed on the upper surface, and the antenna under test is removably disposed in the receiving recess.

3. The antenna detection system of claim 2, wherein the second substrate further has a wire groove disposed on the upper surface, in communication with the receiving recess, and exposed from a lateral side of the upper surface.

4. The antenna detection system of claim 2, wherein the second substrate is penetrated by a through hole exposed from the lower surface and a bottom of the receiving recess, wherein an antenna unit of the antenna under test is disposed in the through hole whenever the antenna under test is disposed in the receiving recess.

5. The antenna detection system of claim 1, wherein the test device further comprises a limiting element disposed on the second substrate and adapted to fix or release the antenna under test selectively whenever the antenna under test is positioned inside the receiving recess.

6. The antenna detection system of claim 1, wherein the test device further comprises at least a support post disposed between the first substrate and the second substrate and each having an end fixedly connected to the first substrate and another end fixedly connected to the second substrate.

7. The antenna detection system of claim 1, wherein the standard antenna is a passive antenna.

8. The antenna detection system of claim 1, wherein the antenna under test is an active antenna.

9. The antenna detection system of claim 1, wherein the theoretical value is calculated with formulas below:

$$I = G1 + FSPL + G2; \text{ and}$$

$$FSPL = 10\log\left[\left(\frac{4\pi}{c}df\right)^2\right];$$

wherein I denotes the theoretical value, G1 denotes a gain of the standard antenna, G2 denotes an ideal gain of the antenna under test, FSPL denotes free-space path loss, d denotes the interval, f denotes the operating frequency, and c denotes the speed of light.

10. The antenna detection system of claim 1, wherein the antenna under test comprises:
    an antenna unit for receiving the radiation signal; and
    a filter connected between the antenna unit and the low-noise amplifier, wherein the low-noise amplifier is connected between the filter and the second port of the network analyzer.

11. The antenna detection system of claim 10, wherein the interval is a shortest distance between a top end of the antenna unit of the antenna under test and a surface of the standard antenna.

12. An antenna detection method, for detecting an antenna under test, comprising the steps of:
    calculating a theoretical value according to an operating frequency and an interval, with the operating frequency corresponding to the antenna under test, wherein the interval is adjustable according to testing needs;

keeping the antenna under test and a standard antenna at the interval with a test device, wherein the test device comprises a weight that is rotatable about an axial post, the axial post is fixed to the upper surface of the second substrate; and one end of the weight abuts against the antenna under test to thereby fix the antenna under test during a testing session;

generating and sending a test signal from a network analyzer comprising a first port and a second port to the standard antenna;

emitting a radiation signal from the standard antenna according to the test signal;

receiving the radiation signal by the antenna under test and generating a to-be-measured signal according to the radiation signal by the antenna under test comprising a low-noise amplifier;

supplying electric power to the low-noise amplifier by a power supply circuit, wherein the first port of the network analyzer, the standard antenna, the antenna under test, the power supply circuit and the second port of the network analyzer are connected to each other sequentially;

amplifying the to-be-measured signal sent from the antenna under test by the low-noise amplifier;

obtaining a S21 parameter of the antenna under test according to the test signal and the to-be-measured signal by the network analyzer; and comparing the S21 parameter with the theoretical value to thereby generate and send a detection result of the antenna under test.

13. The antenna detection method of claim 12, wherein the test device comprises a first substrate and a second substrate parallel to the first substrate, wherein the standard antenna is fixedly disposed on the first substrate, and the step of keeping the antenna under test and the standard antenna at the interval with the test device comprises disposing removably the antenna under test in a receiving recess on the second substrate and fixing the antenna under test to the second substrate with a limiting element.

14. The antenna detection method of claim 12, further comprising the step of:

calculating the theoretical value with formulas below:

$$I = G1 + FSPL + G2; \text{ and}$$

$$FSPL = 10\log\left[\left(\frac{4\pi}{c}df\right)^2\right];$$

wherein I denotes the theoretical value, G1 denotes a gain of the standard antenna, G2 denotes an ideal gain of the antenna under test, FSPL denotes free-space path loss, d denotes the interval, f denotes the operating frequency, and c denotes the speed of light.

15. The antenna detection method of claim 12, further comprising the step of supplying a power-supply voltage to the antenna under test by the power supply circuit.

16. The antenna detection method of claim 12, wherein the standard antenna is a passive antenna.

17. The antenna detection method of claim 12, wherein the antenna under test is an active antenna.

18. The antenna detection method of claim 12, wherein the interval is a shortest distance between a top end of an antenna unit of the antenna under test and a surface of the standard antenna.

* * * * *